US005596225A

United States Patent [19]
Mathew et al.

[11] Patent Number: 5,596,225
[45] Date of Patent: Jan. 21, 1997

[54] LEADFRAME FOR AN INTEGRATED CIRCUIT PACKAGE WHICH ELECTRICALLY INTERCONNECTS MULTIPLE INTEGRATED CIRCUIT DIE

[75] Inventors: Ranjan J. Mathew, San Jose; Hem P. Takiar, Fremont, both of Calif.

[73] Assignee: National Semiconductor Corporation, Santa Clara, Calif.

[21] Appl. No.: 624,759

[22] Filed: Mar. 27, 1996

Related U.S. Application Data

[63] Continuation of Ser. No. 329,997, Oct. 27, 1994, abandoned.
[51] Int. Cl.$^6$ .......................... H01L 23/495; H01L 23/34; H05K 7/20
[52] U.S. Cl. ..................... 257/667; 257/692; 257/723; 257/724; 257/777; 257/666; 361/723
[58] Field of Search .................... 257/666, 667, 257/672, 673, 690, 692, 723, 724, 725, 777, 778; 361/723

[56] References Cited

U.S. PATENT DOCUMENTS

4,862,322  8/1989  Bickford et al. ................... 257/723

FOREIGN PATENT DOCUMENTS

| 0405330 | 1/1991 | European Pat. Off. . | |
| 0405330A3 | 1/1991 | European Pat. Off. | 23/495 |
| 3120750 | 5/1991 | European Pat. Off. . | |
| 0595021 | 5/1994 | European Pat. Off. . | |
| 0595021A1 | 5/1994 | European Pat. Off. | 25/65 |
| 6188280 | 7/1994 | European Pat. Off. . | |
| 03120750 | 5/1991 | Japan . | |
| 448769 | 2/1992 | Japan | 257/723 |
| 0188280 | 7/1994 | Japan . | |

OTHER PUBLICATIONS vol. 18 No. 531 (e–1614) 07 Oct. 1994.
vol. 015 No. 323 (e–1101) 16 Aug. 1991.

*Primary Examiner*—Carl Whitehead, Jr.
*Attorney, Agent, or Firm*—Hickman Beyer & Weaver

[57] ABSTRACT

A leadframe for use in an integrated circuit package including at least one integrated circuit die attached to the leadframe and an encapsulant material surrounding the die and portions of the leadframe is herein disclosed. The leadframe includes a central portion having a plurality of perforations through the central portion adapted to allow the flow of the encapsulant material through the perforations during the molding process of the manufacture of the integrated circuit package thereby (i) preventing the flow of the encapsulant material from shifting the die attach pad during the manufacture of the package and (ii) providing anchoring for the encapsulant material to the leadframe to prevent delamination and cracking of the package. In one embodiment of the present invention, the perforations in the central portion of the leadframe are diagonal perforations forming therebetween diagonal electrically conductive strips electrically isolated from one another and each of which is continuous with at least one of the electrically conductive leads in the peripheral portion of the leadframe. The electrically conductive strips are adapted to provide means for electrically interconnecting a first and a second integrated circuit memory die attached to the top and the bottom side of the die attach pad segment of the leadframe. In accordance with another feature of the present invention, the electrically conductive strips and their associated electrically conductive leads are adapted to provide thermal conduction paths through each of the leads for the integrated circuit die when the die is attached to the die attach pad segment of the central portion of the leadframe.

21 Claims, 5 Drawing Sheets

LEADFRAME FOR AN INTEGRATED CIRCUIT PACKAGE WHICH ELECTRICALLY INTERCONNECTS MULTIPLE INTEGRATED CIRCUIT DIE

This is a continuation of application Ser. No. 08/329,997 filed Oct. 27, 1994 now abandoned.

BACKGROUND OF THE INVENTION

The present invention relates generally to leadframes for use in an integrated circuit package and more specifically to a particularly designed leadframe which prevents die pad shifting during the molding of the package, prevents delamination and cracking of the package, and provides an arrangement for electrically interconnecting multiple integrated circuit die attached directly to the leadframe without the use of an additional substrate or interfacing board.

In the field of integrated circuit packaging the cost of the components making up the package and the complexity of the manufacturing process are of major concern. Any improvement which simplifies the manufacturing process, improves the durability of the package, or reduces the cost of the components making up an integrated circuit package can provide a significant commercial advantage. Also, in order to reduce the amount of material required to produce a given package and reduce the space required by the finished integrated circuit package, packages are being made smaller and thinner. Because of these factors, the packaging of integrated circuits is continuously being improved to provide smaller more cost effective designs and methods for producing integrated circuit packages.

Referring initially to FIG. 1, a current prior art single chip integrated circuit package generally indicated by reference numeral 10 will be described. Package 10 includes a leadframe 12, a die attach pad 14, an integrated circuit die 16, and a molded encapsulant material 18 surrounding die attach pad 14, die 16, and portions of leadframe 12. Integrated circuit die 16 is typically attached to die attach pad 14 using a die attach adhesive and the die is typically electrically connected to leadframe 12 using an array of conventional bonding wires, one of which is indicated by reference numeral 22. On thin integrated circuit packages, die pad shift due to the injection of the encapsulant material during molding of the package is a common manufacturing problem. This is caused by uneven pressures generated above and below the die attach pad during the injection of the encapsulant material. Also, because of the small amount of cross sectional area of encapsulant material between the upper portion and the lower portion of the molding material (especially in the case of a large die attach pad), delamination of the mold compound from the leadframe is another manufacturing problem. The present invention provides a leadframe which eliminates these problems.

Referring to FIGS. 2A and 2B, two typical prior art multi-chip integrated circuit package designs generally designated by reference numerals 24 and 26 respectively will be described. Multi-chip package 24 includes a leadframe 28, a die attach pad 30, an interconnecting substrate 32, two integrated circuit die 34, and a molded encapsulant material 36 surrounding pad 30, substrate 32, die 34 and portions of leadframe 28. Die 34 are electrically interconnected and electrically connected to leadframe 28 using a combination of interconnecting substrate 32 and an array of bonding wires 38. Typically interconnecting substrate 32 includes electrically conductive paths or traces (not shown) laid out to position bonding pads (also not shown) in appropriate locations for bonding wires 38 to complete the electrical interconnection of the two die 34. In the case of FIG. 2B, die attach pad 30 is eliminated and substrate 32 is attached directly to leadframe 28. In addition to having the problems described above for single chip packages, the described typical prior art multi-chip packages have the added disadvantage of the additional cost of the interconnecting substrate 32 which must include the required electrically conductive paths. Also, there is the additional manufacturing cost of attaching substrate 32 to die attach pad 30 or leadframe 28 depending on which of the described approaches is used. The present invention provides a leadframe which is used without an interconnecting substrate to interconnect the die, therefore eliminating the need for an interconnecting substrate and eliminating the need to attach the substrate to the leadframe.

SUMMARY OF THE INVENTION

As will be described in more detail hereinafter, a leadframe is disclosed herein for use in an integrated circuit package including at least one integrated circuit die having a bottom surface attached to the leadframe and an encapsulant material surrounding the die and portions of the leadframe. The leadframe includes a central portion having a top and a bottom surface and a peripheral portion at least partially surrounding the central portion. The peripheral portion includes an array of electrically conductive leads adapted to electrically connect the integrated circuit package to external elements. The central portion includes at least one die attach pad segment adapted to have the bottom surface of at least one integrated circuit die attached to the die attach pad. In accordance with the present invention, the central portion also has a plurality of perforations through the central portion of the leadframe adapted to allow the flow of the encapsulant material through the perforations during the molding process of the manufacture of the integrated circuit package thereby (i) preventing the flow of the encapsulant material from shifting the die attach pad during the manufacture of the package and (ii) providing anchoring for the encapsulant material to the leadframe to prevent delamination and cracking of the package.

In one embodiment of the present invention, the perforations in the central portion of the leadframe are diagonal perforations forming therebetween diagonal electrically conductive strips electrically isolated from one another and each of which is continuous with at least one of the electrically conductive leads in the peripheral portion of the leadframe. The electrically conductive strips are adapted to provide means for electrically interconnecting a first integrated circuit die, for example a memory die in this embodiment, and a second integrated circuit die, which may also be a memory die, attached to the leadframe, each die including a plurality of die input/output pads positioned adjacent to opposite ends of the die. The plurality of die input/output pads on the first and second integrated circuit memory die have the same sequence such that the function of each input/output pad on the first die corresponds to the function of a respective input/output pad on the second die located in a similar relative position on the second die. The top surface of the die attach pad segment of the central portion of the leadframe is adapted to receive the bottom surface of the first integrated circuit die. The bottom surface of the die attach pad segment of the leadframe is adapted to receive the bottom surface of the second integrated circuit memory die such that the second integrated circuit memory die is rotated ninety degrees relative to the first integrated circuit memory die and such that the positions of each respective corresponding die input/output pad on the first and second memory die are in line with one another along diagonally oriented lines which generally correspond to the diagonally running electrically conductive strips, thereby providing means for electrically interconnecting the first and second memory die.

In accordance with another feature of the present invention, the electrically conductive strips and their associated electrically conductive leads are adapted to provide thermal conduction paths through each of the leads for the integrated circuit die when the die is attached to the die attach pad segment of the central portion of the leadframe.

BRIEF DESCRIPTION OF THE DRAWINGS

The features of the present invention may best be understood by reference to the following description of the presently preferred embodiments together with the accompanying drawings in which.

DETAILED DESCRIPTION OF THE PREFERRED EMBODIMENTS

Figure 1:
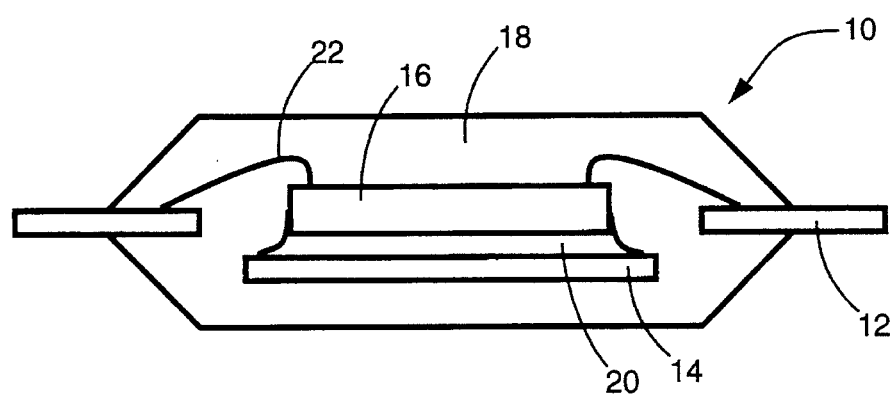
FIG. 1 is a diagrammatic cross sectional view of a typical single chip prior art integrated circuit package.
Figure 2A:
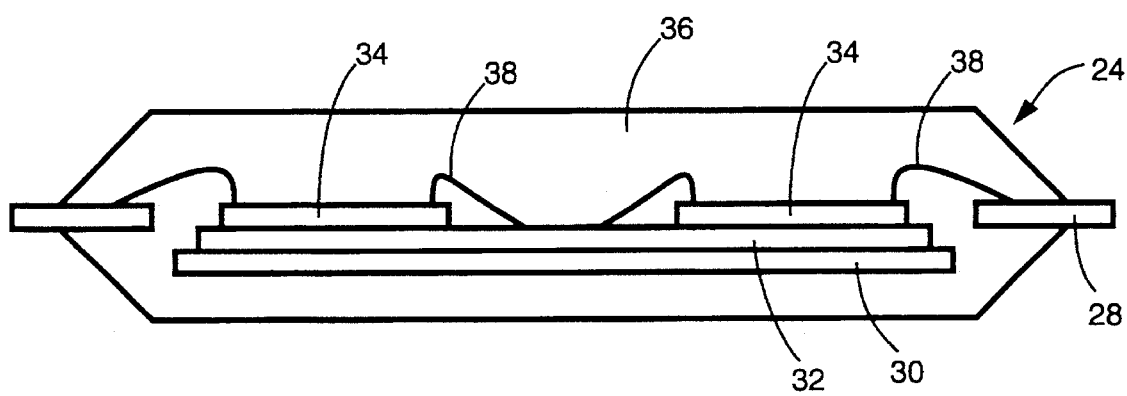
FIG. 2A and 2B are diagramatic cross sectional views of typical multi-chip prior art integrated circuit packages.
Figure 2B:
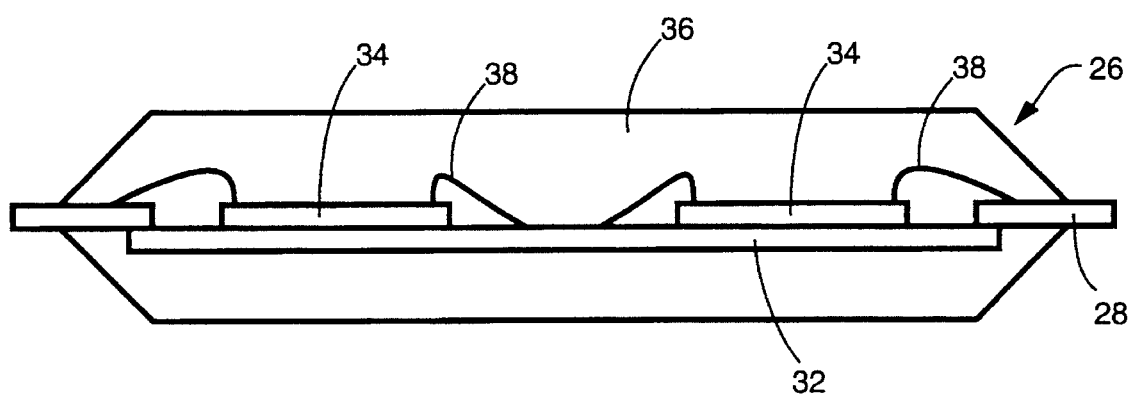
Figure 3:
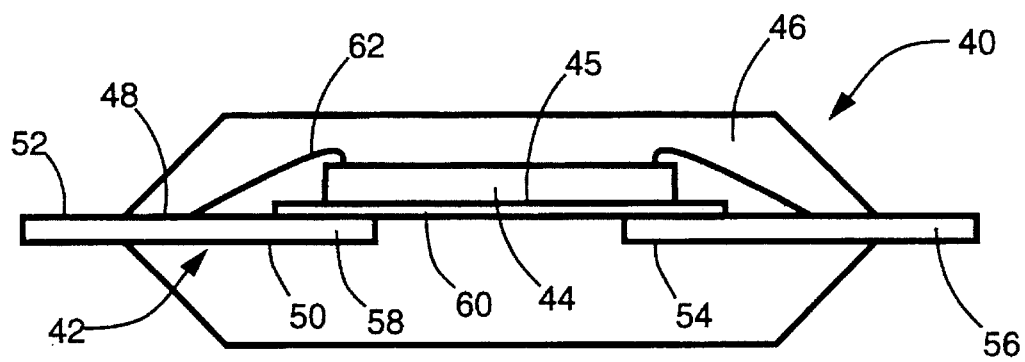
FIG. 3 is a diagrammatic cross sectional view of a single chip integrated circuit package designed in accordance with the present invention.

Inasmuch as FIGS. 1 through 2B were discussed previously, attention is directed to FIG. 3 which illustrates a preferred embodiment of a single chip version of an integrated circuit package designed in accordance with the present invention and generally designated by reference numeral 40. Package 40 includes a leadframe 42, an integrated circuit die 44 having a bottom surface 45, and an encapsulant material 46 surrounding die 44 and portions of leadframe 42. Leadframe 42 is substantially planar having a top surface 48, a bottom surface 50, a peripheral portion 52, and a central portion 54. However, in accordance with the present invention, leadframe 42 does not include a conventional recessed die attach pad. Peripheral portion 52 includes an array of electrically conductive leads, one of which is indicated by 56, which are adapted to electrically connect integrated circuit package 40 to external elements. Central portion 54 includes a die attach pad segment 58. In accordance with the present invention, bottom surface 45 of die 44 is attached to top surface 48 of leadframe 42 on the die attach pad segment 58 using a conventional and readily available electrically non-conductive adhesive 60. For the reasons that follow, the adhesive should also be thermally conductive. Die 44 is electrically connected to leads 56 of leadframe 42 using an array of conventional and readily providable bonding wires, one of which is indicated at 62.

Figure 4:
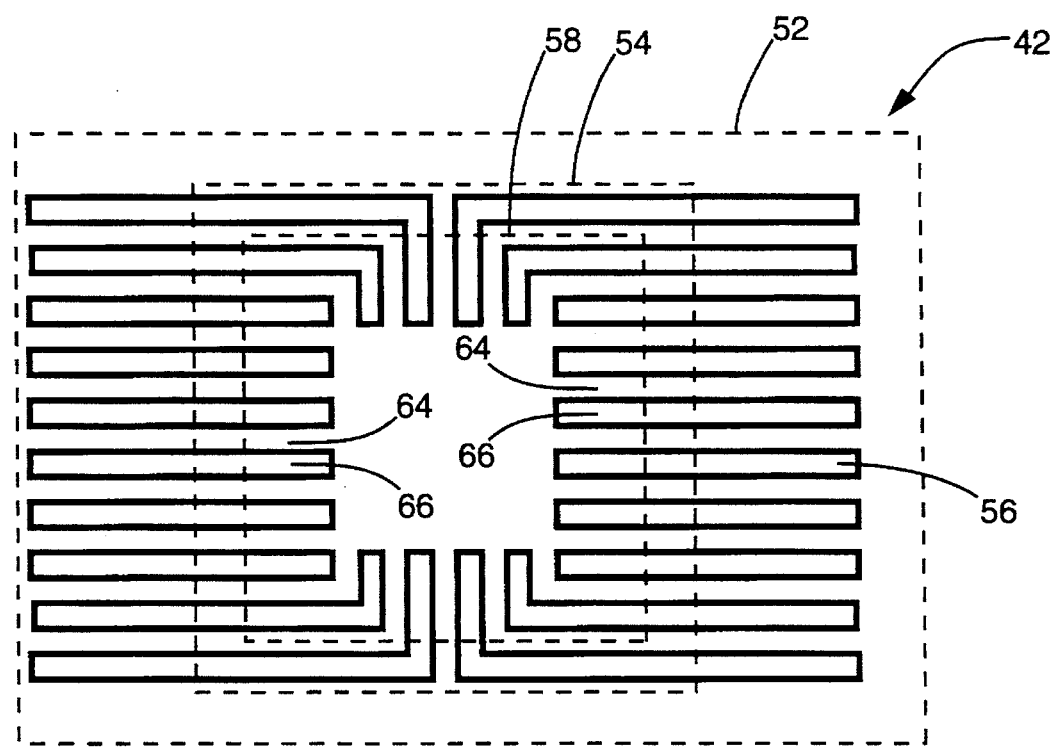
FIG. 4 is a diagrammatic plan view of a preferred embodiment of a leadframe designed in accordance with the present invention.

Referring to FIG. 4 which is a plan view of a preferred embodiment of leadframe 42, in accordance with the present invention, the central portion 54 of leadframe 42 has a plurality of perforations indicated by 64. In this embodiment, the perforations are continuous perforations forming therebetween electrically conductive strips 66, each of which is continuous with at least one of electrically conductive leads 56. With this arrangement for leadframe 42 and in accordance with the present invention, when the encapsulant material (not shown in FIG. 4) is injected around leadframe 42 and the die (also not shown in FIG. 4), perforations 64 allow for even flow both above and below integrated circuit die 44. In other words, the perforations allow the encapsulant material to easily flow either up or down through the perforations thereby eliminating the unbalanced pressures which cause the die attach pad of prior art integrated circuit packages to shift during the injection of the encapsulant material. Also, as the encapsulant material hardens within the perforations, it bonds the upper and lower portions of the overall encapsulant material. This relatively large cross sectional area of encapsulant material which extends through the leadframe eliminates the above mentioned prior art problem of delamination and cracking.

An additional feature of the present invention is that one particular leadframe size may be easily used for a variety of integrated circuit die. This is because the central portion of the leadframe 42 is substantially planar allowing a given die to overlap the electrically conductive strips in the central portion of the leadframe as much as necessary rather than being recessed and positioned on a die attach pad which is typically specifically designed for a certain size die in the case of prior art integrated circuit packages. This improves the cost effectiveness of a leadframe designed in accordance with the present invention by increasing the potential usage of a particular size leadframe.

Another feature of the present invention provides improved heat dissipating characteristics for integrated circuit package 40. Since leads 56 and their associated electrically conductive strips 66 are directly connected to integrated circuit die 44 using an electrically non-conductive adhesive as described above, each electrically conductive strip 66 and lead 56 acts as a heat conducting path. For example, applicants have found that using a leadframe designed in accordance with the present invention versus a conventional leadframe for a SO-20 type package with a 18000 square mil die provides a 22% improvement in thermal dissipating capability. This feature again improves the cost effectiveness of the present invention leadframe by increasing further the applications in which it may be used, or in some cases, by eliminating the need for adding special heat dissipating components to the overall integrated circuit package. Obviously, it is important that adhesive 60 is thermally conductive as well as being electrically non-conductive. One such adhesive is ABLEFILM® 563K supplied by ABLESTIK®.

Although in the embodiment described above the perforations are continuous forming electrically conductive strips, each of which is continuous with at least one lead, it should be understood that the present invention is not limited to this particular arrangement. Instead, the present invention would apply equally to other embodiments regardless of the specific arrangement of the perforations so long as the die is attached directly to the leadframe, the perforations provide openings to prevent the shifting of the die attach pad during the molding process, and the perforations provide anchoring for the encapsulant material to the leadframe to prevent delamination and cracking.

Figure 5:
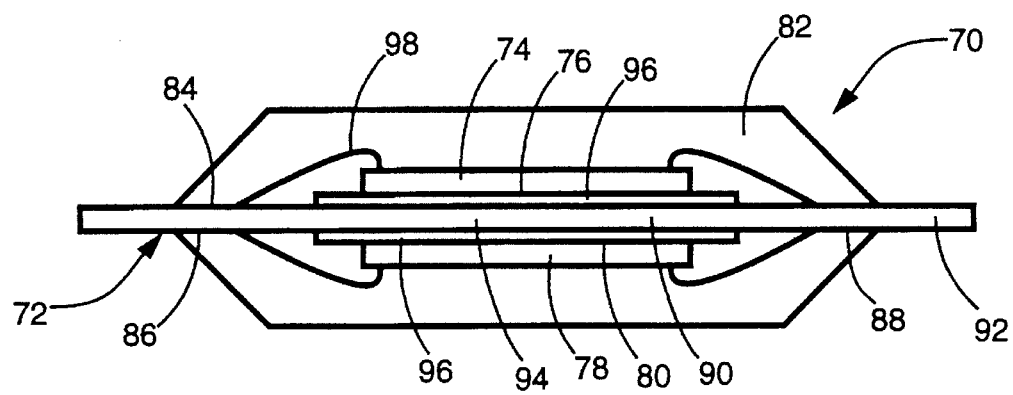
FIG. 5 is a diagramatic cross sectional view of a multi-chip integrated circuit package designed in accordance with the present invention.
Figure 6:
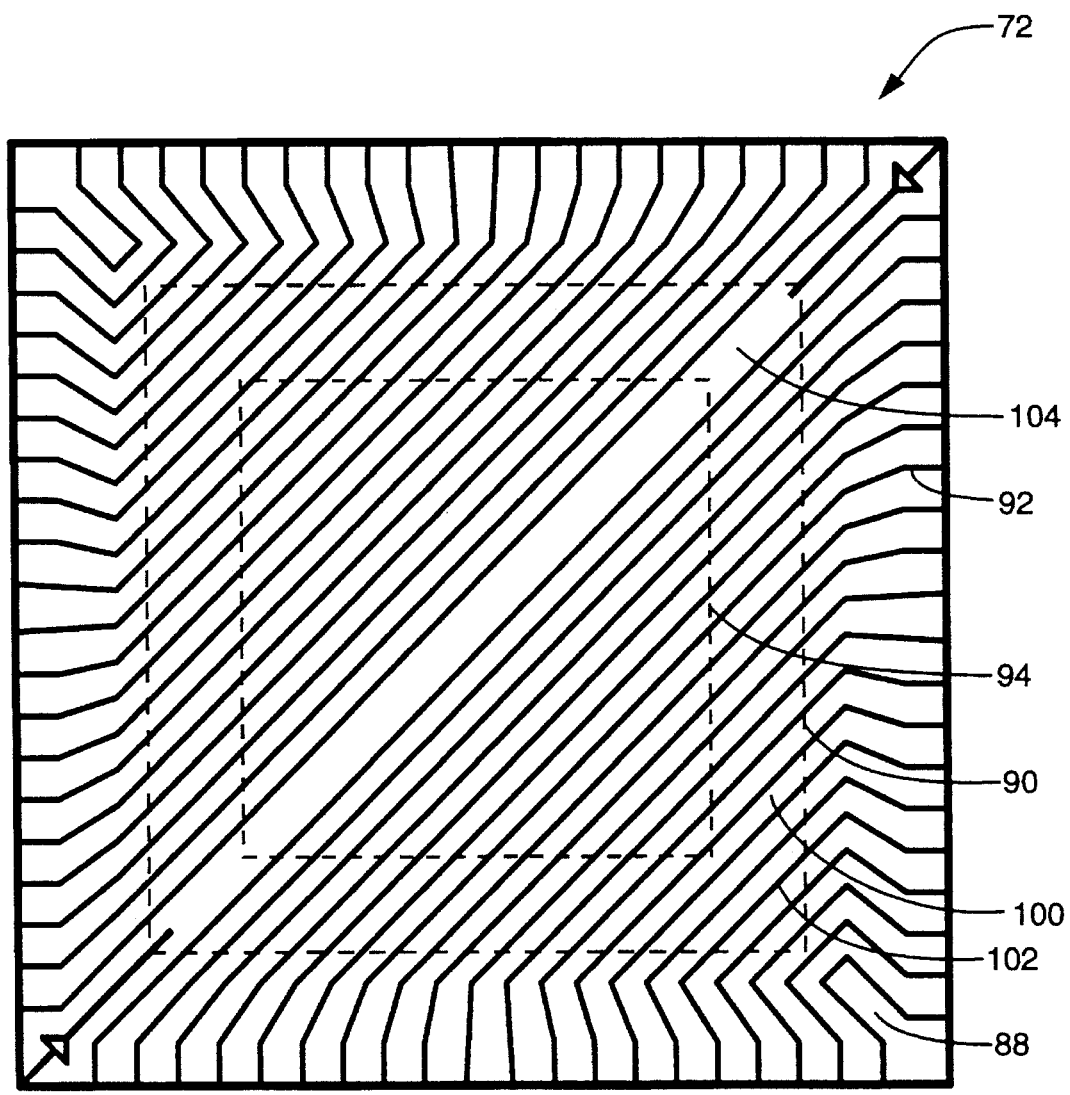
FIG. 6 is a diagrammatic plan view of another preferred embodiment of a leadframe designed in accordance with the present invention.

Referring to FIGS. 5 and 6, another embodiment of an integrated circuit package designed in accordance with the present invention and generally designated by reference numeral 70 will be described. In this embodiment, in addition to the features described above for a single chip version, the leadframe of the integrated circuit package is also used to electrically interconnect two integrated circuit die attached to opposite sides of the leadframe. Package 70 includes a leadframe 72, a first integrated circuit die 74 having a bottom surface 76, a second integrated circuit die 78 having a bottom surface 80, and an encapsulant material 82 surrounding die 74 and 78 and portions of leadframe 72. Leadframe 72 is substantially planar having a top surface 84, a bottom surface 86, a peripheral portion 88, and a central portion 90. Peripheral portion 88 includes an array of electrically conductive leads, one of which is indicated by 92, which are adapted to electrically connect integrated circuit package 70 to external elements. Central portion 90 includes a die attach pad segment 94. As shown in FIG. 5 and as will be described in more detail hereinafter, bottom surface 76 of die 74 is attached to top surface 84 of leadframe 72 on the die attach pad segment 94 using a conventional and readily available electrically non-conductive but thermally conductive adhesive 96. Bottom surface 80 of die 78 is attached to bottom surface 86 of leadframe 72 on the die attach pad segment 94 using adhesive 96. Both die 74 and 78 are electrically connected to leads 92 of leadframe 72 using an array of conventional and readily providable bonding wires, one of which is indicated at 98. As will be described in more detail later, die 74 and 78 are also electrically interconnected using a combination of bonding wires 98 and portions of leadframe 72.

Referring to FIG. 6 which is a plan view of a preferred embodiment of leadframe 72, in accordance with the present invention, the central portion 90 of leadframe 72 has a plurality of perforations indicated by 100. In this embodiment, the perforations are continuous perforations running diagonally through central portion 90 forming therebetween diagonal electrically conductive strips 102, each of which is continuous with at least one of electrically conductive leads 92. Also, in this particular embodiment, central portion 90 of leadframe 72 has at least one enlarged and elongated perforation 104 extending across at least the entire die attach pad segment 94 of leadframe 72. This enlarged perforation 104 is designed to allow the flow of encapsulant material 82 between die 74 and die 78.

With the immediately above described arrangement for leadframe 72 and as described above for the single integrated circuit die version of the present invention, when the encapsulant material 82 is injected around leadframe 72 and die 74 and 78, perforations 100 and 104 allow for even flow both above and below integrated circuit die 74 and 78 thereby eliminating die shift during the injection of the encapsulant material. Also as mentioned above, as the encapsulant material hardens within the perforations, it bonds the upper and lower portions of the overall encapsulant material eliminating the above mentioned prior art problem of delamination and cracking.

Figure 7:
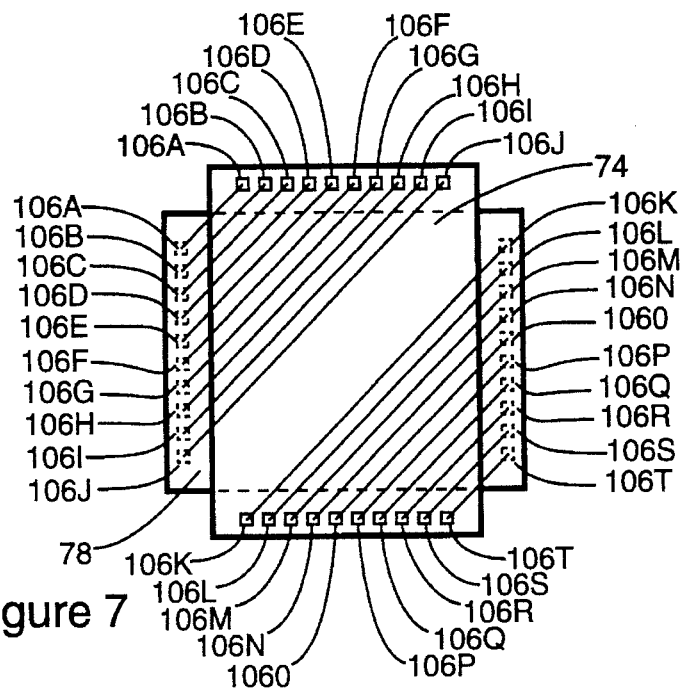
FIG. 7 is a diagrammatic plan view of a preferred relative positioning of two memory integrated circuit die for the present invention.
Figure 8:
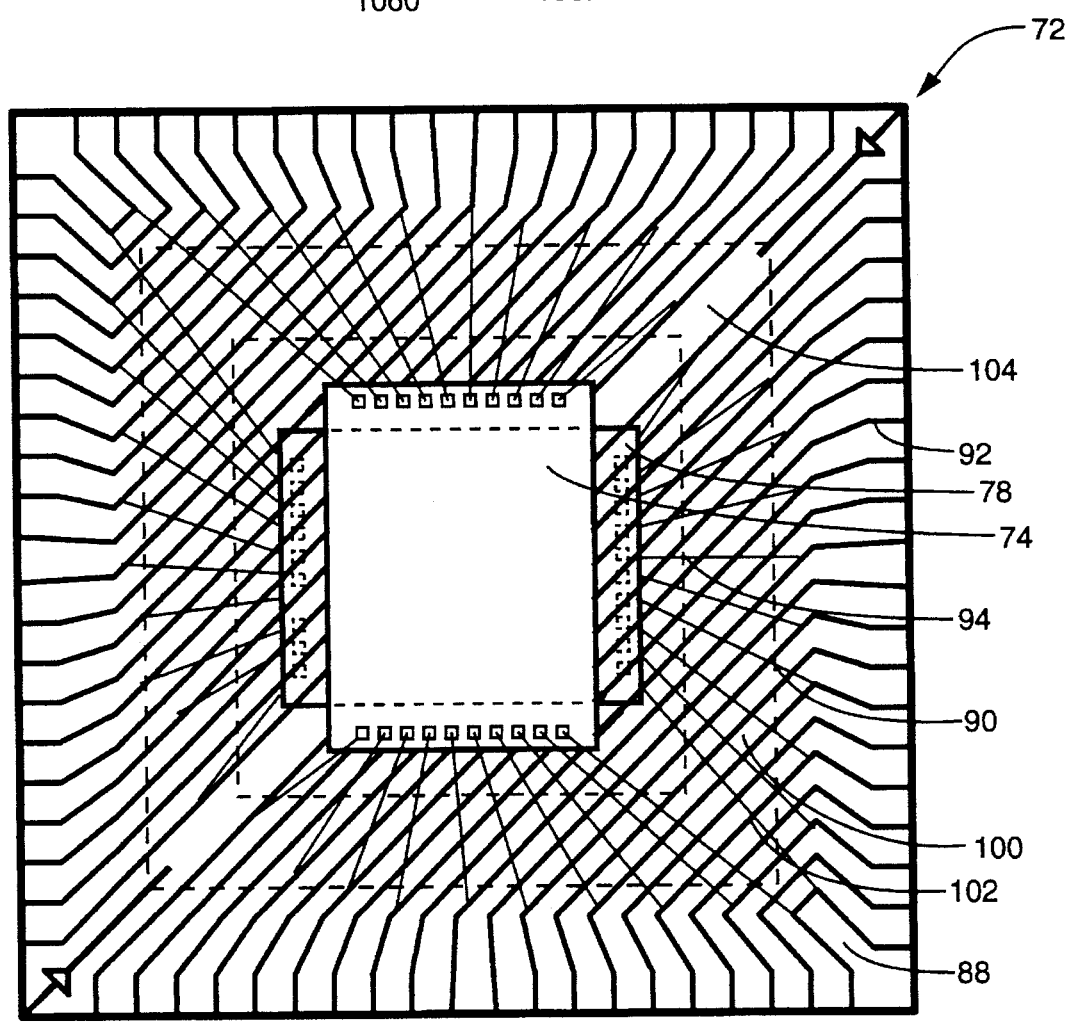
FIG. 8 is a diagrammatic plan view of the leadframe shown in FIG. 6 including the memory integrated circuit die shown in FIG. 7.

Referring now to FIGS. 7 and 8, the positioning of integrated circuit die 74 and 78 will be described in detail. In the embodiment being described, both integrated circuit die 74 and 78 am memory integrated circuit die. As is common for memory die, die 74 and 78 include a plurality of die input/output pads 106A–T located adjacent to opposite ends of die 74 and 78. Also as is typically the case for memory die, each of die input/output pads 106A–T on die 74 has the same sequence as the input/output pads on die 78 such that the function of each pad on die 74 corresponds to the function of a respective input/output pad on die 78 located in a similar relative position on die 78. As shown in FIG. 7, by positioning die 74 face up and die 78 face down such that bottom surface 76 of die 74 is facing the bottom surface 80 of die 78 and by rotating die 78 ninety degrees relative to die 74, each respective corresponding input/output pad 106A–T on die 74 is lined up with it's corresponding input/output pad 106A–T on die 78 along parallel diagonal lines.

As shown in FIGS. 5, 7, and 8, and in accordance with the present invention, die 74 and die 78 are attached to leadframe 72 using electrically non-conductive and thermally conductive adhesive 96 as described above such that the diagonal electrically conductive strips 102 of leadframe 72 are substantially parallel with the diagonal line-up lines extending between input/output pads on die 74 and 76. This arrangement positions corresponding input/output pads 106A–T on die 74 and 78 generally in line with one of the diagonally running electrically conductive strips 102. To electrically interconnect together memory die 74 and 78 in accordance with the present invention, each input/output pad 106A–T on memory die 74 is wire bonded using a conventional and readily providable bonding wire to an adjacent point on a corresponding diagonally running electrically conductive strip 102. Also, each corresponding input/output pad 106A–T on die 78 is wire bonded to an adjacent point on the same corresponding diagonally running electrically conductive strip 102, thereby interconnecting corresponding pads on die 74 and 78. Also, since each of the diagonally running electrically conductive strips 102 is continuous with at least one of the leads 92, the above described wire bonding arrangement also electrically connects corresponding input/output pads of die 74 and 78 to a respective electrically conductive lead 92.

The above described multi-chip version of the present invention provides a more cost effective arrangement than prior art multi-chip packages by eliminating the need for any type of substrate or interfacing board to electrically interconnect the multiple integrated circuit die. Also, as mentioned above for the single chip version, any particular size of leadframe may be easily used for a variety of integrated circuit die. This is because the leadframe is substantially planar allowing a given die to overlap the electrically conductive strips in the central portion of the leadframe as much as necessary rather than being recessed and positioned on a die attach pad which is typically specifically designed for a certain size die in the case of prior art integrated circuit packages. This further improves the cost effectiveness of a leadframe designed in accordance with the present invention by increasing the potential usage of a particular size leadframe.

Also as mentioned above for the single chip version, another feature of the present invention provides improved heat dissipating characteristics for integrated circuit package 70. Since leads 92 and their associated electrically conductive strips 102 are directly connected to integrated circuit die 74 and 78 using an electrically non-conductive and thermally conductive adhesive as described above, each electrically conductive strip 102 and lead 92 acts as a heat conducting path. This feature again improves the cost effectiveness of the present invention leadframe by increasing further the applications in which it may be used, or in some cases, by eliminating the need for adding special heat dissipating components to the overall integrated circuit package.

Figure 9:
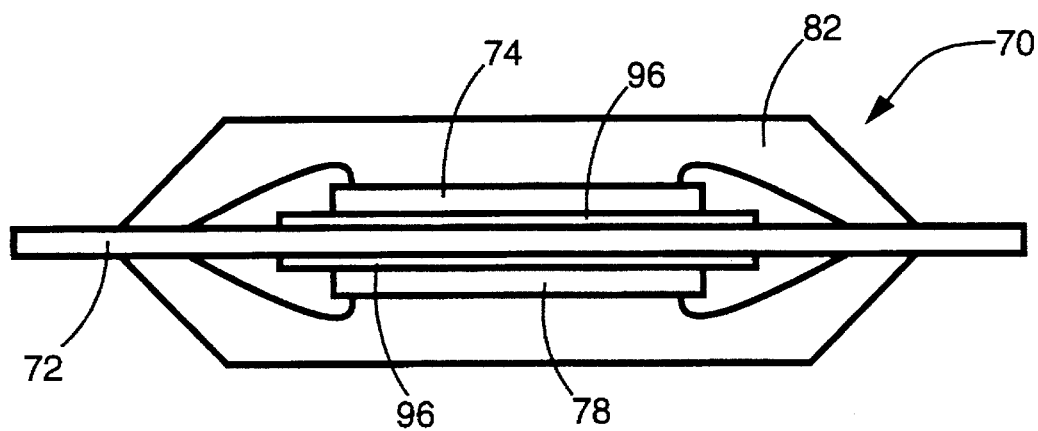
FIG. 9 is a diagrammatic cross sectional view of another preferred embodiment of a multi-chip version of the present invention.

Referring to FIG. 9, another feature of the present invention provides for producing a dual chip thin package. In this example, integrated circuit package 70 has an overall thickness of fifty six mil. This is made up of integrated circuit die 74 and 78 each having a thickness of twelve mil, two layers of non-conductive adhesive 96 three mils thick attaching die 74 and 78 to leadframe 72, two layers of protective encapsulant material ten mils thick above die 74 and below die 78, and a six mil thick copper leadframe.

Figure 10:
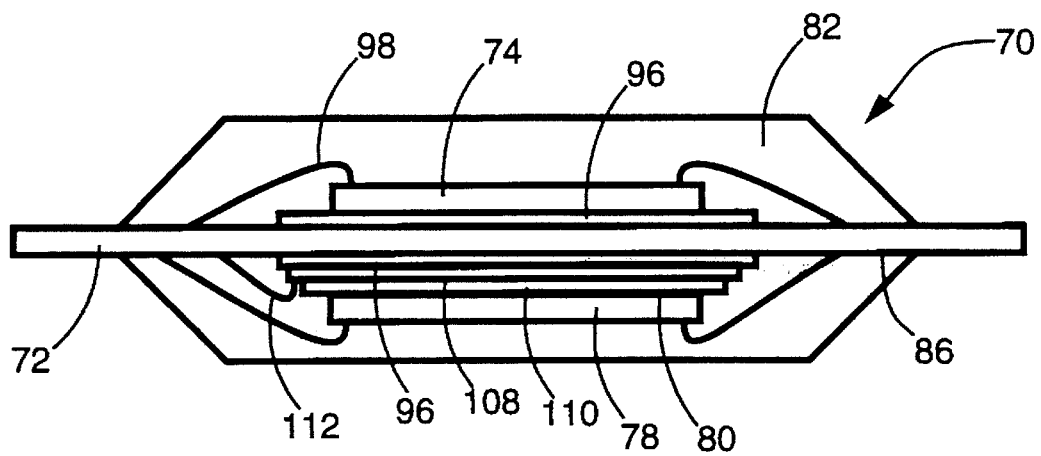
FIG. 10 is a diagrammatic cross sectional view of another preferred embodiment of a multi-chip version of the present invention including a grounding sheet for one of the integrated circuit die.

In some situations, integrated circuit die use their bottom surface as a ground connection. In this case, as illustrated in FIG. 10 and in accordance with the present invention, a metallized grounding plane or sheet 108 is included in integrated circuit package 70. In this example, grounding sheet 108 is attached to the bottom surface 86 of leadframe 72 using electrically non-conductive adhesive 96. Die 78 is then attached to grounding sheet 108 using an electrically conductive adhesive 110. This conductive adhesive provides an electrical connection between the grounding sheet and the bottom surface of die 78. Also, during the wire bonding process, grounding sheet 108 is wire bonded using a bonding wire 112 to the appropriate electrically conductive lead 92. As shown in FIG. 10, this particular package may also be produced in a thin package fifty six mils thick. In this case, die 74 is twelve mils thick, each of the three layers of adhesive are three mils thick, grounding sheet 108 is also three mils thick, die 78 is ten mils thick, leadframe 72 is six mils thick, the encapsulant material above die 74 is ten mils thick, and the encapsulant material below die 78 is six mils thick resulting in a total thickness of fifty six mil.

Although only a few embodiments of the present invention have been described in detail, it should be understood that the present invention may be embodied in many other specific forms without departing from the spirit or scope of the invention. For instance, the multi-chip version of the present invention was described as using two memory integrated circuit die. It should be understood that the present invention is not limited to memory die of this type, but instead would equally apply regardless of the type of die used. Also, for the multi-chip version described, the electrically conductive strips of the leadframe were diagonally running parallel strips. This is not a requirement of the present invention and therefore, other arrangements for the conductive strips or perforations would still fall within the scope of the invention.

Therefore, the present examples are to be considered as illustrative and not restrictive, and the invention is not to be limited to the details given herein, but may be modified within the scope of the appended claims.

What is claimed is:

1. A leadframe for use in an integrated circuit package, said leadframe comprising a central portion having a top and a bottom surface and a peripheral portion at least partially surrounding said central portion, said peripheral portion including an array of electrically conductive leads for electrically connecting said integrated circuit package to external elements, said central portion including at least one die attach pad segment for receiving a first integrated circuit die, and said central portion having a plurality of perforations through said central portion of said leadframe for allowing the flow of said encapsulant material through said perforations during the molding process of the manufacture of said integrated circuit package, said perforations including a first perforation running diagonally and continuously through said central portion of said leadframe and including additional perforations running parallel with said first perforation forming therebetween diagonal electrically conductive strips each of which is integrally formed as part of and continuous with at least one of said electrically conductive leads in the peripheral portion of the leadframe.

2. A leadframe as set forth in claim 1 wherein said perforations in said central portion of said leadframe are elongated perforations forming therebetween an array of electrically conductive strips which are electrically isolated from one another, said electrically conductive strips providing means for electrically interconnecting said first integrated circuit die and a second integrated circuit die attached to said leadframe.

3. A leadframe as set forth in claim 2 wherein at least one of said perforations is an enlarged and elongated perforation extending across at least the entire length of said die attach pad segment of the leadframe, said enlarged and elongated perforation allowing an encapsulant material to easily flow between said first and said second integrated circuit die during the manufacture of said integrated circuit package when said first and second die are attached to the top and bottom surface of said die attach pad segment of the leadframe.

4. A leadframe for use in an integrated circuit package including at least one integrated circuit die and an encapsulant material surrounding said die and portions of said leadframe, said leadframe comprising a top surface, a bottom surface, a central portion and a peripheral portion at least partially surrounding said central portion, said peripheral portion including an array of electrically conductive leads for electrically connecting said integrated circuit package to external elements, said central portion including a die attach pad segment for receiving (i) a first integrated circuit die having a bottom surface attached to said top surface of the die attach pad segment of the central portion of the leadframe and (ii) a second integrated circuit die having a bottom surface attached to the bottom surface of the die attach pad segment of the central portion of the leadframe, and said central portion having a plurality of elongated perforations forming therebetween a plurality of electrically isolated strips providing means for electrically interconnecting said first and second integrated circuit die mounted on opposite sides of said leadframe each of said electrically conductive strips being integrally formed as part of and continuous with at least one of said electrically conductive leads making up said array of electrically conductive leads in the peripheral portion of the leadframe, and said perforations in said central portion of said leadframe being continuous along the entire length of said electrically conductive strips.

5. An integrated circuit package comprising;
 a) a lead frame including a central portion having a top and a bottom surface and a peripheral portion at least partially surrounding said central portion, said peripheral portion including an array of electrically conductive leads for electrically connecting said integrated circuit package to external elements, said central portion including at least one die attach pad segment, and said central portion having a plurality of perforations through said central portion of said leadframe for allowing the flow of said encapsulant material through said perforations during the molding process of the manufacture of said integrated circuit package, said perforations including a first perforation running diagonally and continuously through said central portion of said leadframe and including additional perforations running parallel with said first perforation forming therebetween diagonal electrically conductive strips each of which is integrally formed as part of and continuous with at least one of said electrically conductive leads in the peripheral portion of the leadframe b) at least one integrated circuit die having a bottom surface attached to said die attach pad segment of said leadframe, and c) an encapsulant material surrounding said die and portions of said leadframe.

6. An integrated circuit package as set forth in claim 5 wherein said electrically conductive strips provide means for electrically interconnecting a first integrated circuit die and a second integrated circuit die attached to said leadframe.

7. An integrated circuit package as set forth in claim 6 wherein the bottom surface of said first integrated circuit die is attached to the top surface of said die attach pad segment of the central portion of said leadframe and the bottom surface of said second integrated circuit die is attached to the bottom surface of said die attach pad segment of the central portion of the leadframe.

8. An integrated circuit package as set forth in claim 7 wherein at least one of said perforations is an enlarged and elongated perforation extending across at least the entire length of said die attach pad segment of the leadframe, said enlarged and elongated perforation allowing said encapsulant material to easily flow between said first and said second integrated circuit die during the manufacture of said integrated circuit package after said first and second die are attached to the top and bottom surface of said die attach pad segment of the leadframe.

9. An integrated circuit package comprising;

a) a leadframe including a central portion having a top and a bottom surface and a peripheral portion at least partially surrounding said central portion, said peripheral portion including an array of electrically conductive leads for electrically connecting said integrated circuit package to external elements, said central portion including at least one die attach pad segment having a top surface and a bottom surface, and said central portion having a plurality of perforations through said central portion of said leadframe for allowing the flow of said encapsulant material through said perforations during the molding process of the manufacture of said integrated circuit package, said perforations in said central portion of said leadframe being elongated perforations forming therebetween an array of electrically conductive strips which are electrically isolated from one another, said electrically conductive strips providing means for electrically interconnecting a first integrated circuit die and a second integrated circuit die attached to said leadframe, each of said electrically conductive strips being integrally formed as part of and continuous with at least one of said electrically conductive leads making up said array of electrically conductive leads in the peripheral portion of the leadframe and said perforations in said central portion of said leadframe being continuous along the entire length of said electrically conductive strips b) a first integrated circuit die having a bottom surface attached to said top surface of said die attach pad segment of said leadframe and a second integrated circuit die having a bottom surface attached to said bottom surface of said die attach pad segment of said leadframe, and c) an encapsulant material surrounding said first and second die and portions of said leadframe.

10. A leadframe for use in an integrated circuit package, the leadframe comprising;

a) a central portion having a top and a bottom surface, the central portion having a plurality of perforations including a first perforation running diagonally and continuously through the central portion of the leadframe and including additional perforations running parallel with said first perforation forming therebetween diagonal electrically conductive strips which are electrically isolated from one another, the electrically conductive strips providing at least a portion of an arrangement for electrically interconnecting a first die attached to the top surface of the central portion of the leadframe and a second die attached to the bottom surface of the central portion of the leadframe, the first and the second die having a first surface and a second surface including a plurality of die input/output pads positioned adjacent to opposite ends of the second surface of each of the die, the plurality of die input/output pads on the first and second die having the same sequence and function such that the function of each input/output pad on the first die corresponds to the function of a respective input/output pad on the second die located in a similar relative position on the second die, and b) a peripheral portion at least partially surrounding the central portion, the peripheral portion including an array of electrically conductive leads for electrically connecting the integrated circuit package to external elements, each of the leads being integrally formed as part of and continuous with one of the electrically conductive strips in the central portion of the leadframe such that when the first surface of the first die is attached to the top surface of the central portion of the leadframe and the first surface of the second die is attached to the bottom surface of the central portion of the leadframe rotated ninety degrees relative to the first die causing each respective corresponding die input/output pad on the first die to be positioned in line with the corresponding function input/output pad on the second die along parallel oriented lines which are generally parallel with the diagonally running electrically conductive strips, the electrically conductive strips providing at least a portion of the arrangement for electrically interconnecting the first and second die.

11. A leadframe as set forth in claim 10 wherein the electrically conductive strips and their associated electrically conductive leads provide thermal conduction paths through each of the leads for the first and second die when the die are attached to the central portion of the leadframe.

12. A leadframe for use in an integrated circuit package including a first die, a second die, and an encapsulant material surrounding said die and portions of said leadframe, the first and the second die having a first surface and a second surface including a plurality of die input/output pads positioned adjacent to opposite ends of the second surface of each of the die, the plurality of die input/output pads on the first and second die having the same sequence and function such that the function of each input/output pad on the first die corresponds to the function of a respective input/output pad on the second die located in a similar relative position on the second die, the first surface of the first die being attached to the top surface of the leadframe and the first surface of the second die being rotated ninety degrees relative to the first die and attached to the bottom surface of the leadframe such that each respective corresponding die input/output pad on the first die is positioned in line with the corresponding function input/output pad on the second die along a plurality of parallel oriented lines, said leadframe comprising:

a) a central portion having a top and a bottom surface, the central portion having a plurality of perforations including a first perforation running diagonally and continuously through the central portion of the leadframe and including additional perforations running parallel with said first perforation forming therebetween diagonal electrically conductive strips which are electrically isolated from one another and which are generally parallel with said plurality of parallel oriented lines between the corresponding input/output pads on the first and second die, the electrically conductive strips providing at least a portion of an arrangement for electrically interconnecting the first and second die, and b) a peripheral portion at least partially surrounding the central portion, the peripheral portion including an array of electrically conductive leads for electrically connecting the integrated circuit package to external elements, each of the leads being integrally formed as part of and continuous with one of the electrically conductive strips in the central portion of the leadframe thereby electrically connecting the first and second die to external elements.

13. A leadframe as set forth in claim 12 wherein the electrically conductive strips and their associated electrically conductive leads provide thermal conduction paths through each of the leads for the first and second die when the die are attached to the central portion of the leadframe.

14. A leadframe as set forth in claim 13 wherein said first and second die are memory die.

15. An integrated circuit package comprising:

a) a leadframe, said leadframe including
  i) a central portion having a top and a bottom surface, the central portion having a plurality of perforations including a first perforation running diagonally and continuously through the central portion of the leadframe and including additional perforations running parallel with said first perforation forming therebetween diagonal electrically conductive strips which are electrically isolated from one another, and
  ii) a peripheral portion at least partially surrounding the central portion, the peripheral portion including an array of electrically conductive leads for electrically connecting the integrated circuit package to external elements, each of the leads being integrally formed as part of and continuous with one of the electrically conductive strips in the central portion of the leadframe, b) a first find a second die, both the first and the second die having a first surface and a second surface including a plurality of die input/output pads positioned adjacent to opposite ends of the second surface of each of the die, the plurality of die input/output pads on the first and second die having the same sequence and function such that the function of each input/output pad on the first die corresponds to the function of a respective input/output pad on the second die located in a similar relative position on the second die, the first surface of the first die being attached the top surface of the leadframe and the first surface of the second die being rotated ninety degrees relative to the first die and attached to the bottom surface of the leadframe such that the respective corresponding die input/output pads on the first die are in line with their corresponding function input/output pads on the second die along a plurality of parallel oriented lines generally parallel with the diagonally running electrically conductive strips of the leadframe;

c) an array of bonding wires for electrically connecting said die input/output pads to said leadframe such that the electrically conductive strips and the bonding wires provide an arrangement for electrically interconnecting the first and second die, and d) an encapsulating material surrounding the first and second die and portions of the leadframe.

16. An integrated circuit package as set forth in claim 15 wherein the electrically conductive strips and their associated electrically conductive leads provide thermal conduction paths through each of the leads for the first and second die when the die are attached to the central portion of the leadframe.

17. An integrated circuit package as set forth in claim 15 wherein said first and second die are memory die.

18. A leadframe as set forth in claim 4 wherein said perforations include a first perforation running diagonally and continuously through said central portion of said leadframe and include additional perforations running parallel with said first perforation forming therebetween diagonal electrically conductive strips each of which is integrally formed as part of and continuous with at least one of said electrically conductive leads in the peripheral portion of the leadframe.

19. A integrated circuit package as set forth in claim 9 wherein said perforations include a first perforation running diagonally and continuously through said central portion of said leadframe and include additional perforations running parallel with said first perforation forming therebetween diagonal electrically conductive strips each of which is integrally formed as part of and continuous with at least one of said electrically conductive leads in the peripheral portion of the leadframe.

20. A leadframe for use in an integrated circuit package, said leadframe comprising:

a) a central portion having a top and a bottom surface and having a plurality of perforations through said central portion forming therebetween at least one electrically conductive strip extending through said central portion of said leadframe; and b) a peripheral portion at least partially surrounding said central portion and defining a plurality of sides of said leadframe, said peripheral portion including a plurality of electrically conductive leads disposed around said sides of said leadframe, at least some of said electrically conductive leads being used for electrically connecting said integrated circuit package to external elements said electrically conductive strip being integrally formed as part of and continuous with a first and a second one of said electrically conductive leads which are respectively located on adjacent sides of the peripheral portion of said leadframe.

21. An integrated circuit package comprising:
a) a leadframe, said leadframe including
   i) a central portion having a top and a bottom surface, the central portion having a plurality of perforations forming therebetween at least one electrically isolated, electrically conductive strip, and
   ii) a peripheral portion at least partially surrounding the central portion, the peripheral portion including an array of electrically conductive leads at least some of which are used for electrically connecting the integrated circuit package to external elements,
b) a first and a second die, both the first and the second die including a plurality of die input/output pads, the plurality of die input/output pads on the first and second die having the same sequence and function such that the function of each input/output pad on the first die corresponds to the function of a respective input/output pad on the second die located in a similar relative position on the second die, the first die being attached the top surface of the leadframe and the second die being attached to the bottom surface of the leadframe;
c) connecting means for electrically connecting said die input/output pads on said first and second die to said leadframe such that the electrically conductive strip provides at least a portion of an arrangement for electrically interconnecting corresponding die input/output pads of the first and second die, and
d) an encapsulating material surrounding the first and second die and portions of the leadframe.

* * * * *

UNITED STATES PATENT AND TRADEMARK OFFICE
CERTIFICATE OF CORRECTION

PATENT NO. : 5,596,225
DATED : January 21, 1997
INVENTOR(S) : Mathew et al.

It is certified that error appears in the above-indentified patent and that said Letters Patent is hereby corrected as shown below:

Column 3, line 24, change "diagramatic" to --diagrammatic--.
In Claim 5, Column 8, line 62, change "lead frame" to --leadframe--.
In Claim 15, Column 11, line 61, after the first occurrence of "first" change "find" to --and--.

Signed and Sealed this

Twenty-fourth Day of June, 1997

Attest:

BRUCE LEHMAN

Attesting Officer                    Commissioner of Patents and Trademarks